United States Patent [19]
Liou et al.

[11] Patent Number: 5,457,569
[45] Date of Patent: Oct. 10, 1995

[54] SEMICONDUCTOR AMPLIFIER OR LASER HAVING INTEGRATED LENS

[75] Inventors: Kang-Yih Liou, Holmdel; Martin G. Young, South Plainfield, both of N.J.

[73] Assignee: AT&T IPM Corp., Coral Gables, Fla.

[21] Appl. No.: 268,479

[22] Filed: Jun. 30, 1994

[51] Int. Cl.$^6$ .................................................. H01S 3/08
[52] U.S. Cl. ............................ 359/344; 385/33; 372/108
[58] Field of Search ................................ 372/108, 21, 22, 372/23, 43, 50, 99, 101; 359/326, 328, 333, 344, 396; 385/33

[56] References Cited

U.S. PATENT DOCUMENTS

| | | | |
|---|---|---|---|
| 4,292,512 | 9/1981 | Miller et al. | 357/19 |
| 4,932,032 | 6/1990 | Koch et al. | 372/45 |
| 4,935,939 | 6/1990 | Liau et al. | 372/98 |
| 4,942,366 | 7/1990 | Toda | 330/4.3 |
| 5,134,671 | 7/1992 | Koren et al. | 385/14 |
| 5,228,049 | 7/1993 | Paoli | 372/44 |
| 5,260,822 | 11/1993 | Missaggia et al. | 359/337 |
| 5,321,718 | 6/1994 | Waarts et al. | 359/344 X |

OTHER PUBLICATIONS

"2.0 W CW, Diffraction–Limited Operation of a Monolithically Integrated Master Oscillator Power Amplifier," R. Parke, et al., *IEEE Photonics Technology Letters*, vol. 5, No. 3, Mar. 1993, pp. 297–300.
"High–Power, Strained–Layer Amplifiers and Lasers With Tapered Gain Regions," E. S. Kintzer et al., *IEEE Photonics Technology Letters*, vol. 5, No. 6, Jun. 1993, pp. 605–608.
"Multiple–Quantum–Well GaInAs/GaInAsP Tapered Broad–Area Amplifiers with Monolithically Integrated Waveguide Lens for High–Power Applications," F. Koyama et al., *IEEE Photonics Technology Letters*, vol. 5, No. 8, Aug. 1993, pp. 916–919.
"1.3 W CW, diffraction–limited monolithically integrated master oscillator flared amplifier at 863 nm," S. O'Brien et al., *Electronics Letters*, vol. 29, No. 24, 25 Nov. 1993, pp. 2109–2110.
"High–power strained–layer InGaAs/AlGaAs tapered traveling wave amplifier," J. N. Walpole et al., *Applied Physics Letters*, vol. 61, 1192, pp. 740–742.
"High power laser–amplifier photonic integrated circuit for 1.48 µm wavelength operation," U. Koren et al., *Applied Physics Letters*, vol. 59, No. 19, 4 Nov. 1991, pp. 2351–2353.
"A GaInAsP/InP Tapered–Waveguide Semiconductor Laser Amplifier Integrated with a 1.5 µm Distributed Feed Back Laser," P. A. Yazaki et al., *IEEE Transactions Photonics Technology Letters*, vol. 3, No. 12, Dec. 1991, pp. 1060–1063.

*Primary Examiner*—Mark Hellner
*Attorney, Agent, or Firm*—Stuart H. Mayer

[57] ABSTRACT

An optical device includes a semiconductor optical amplifier and a lens for receiving optical energy from the optical amplifier. The lens and the optical amplifier are monolithically integrated on a common substrate. The optical amplifier may be of the type having a tapered active region. Rather than an optical amplifier, a semiconductor laser may be integrated with the lens. The lens may be formed by changing the refractive index of the waveguide core which is formed in the semiconductor material. This refractive index change may be produced by changing the thickness of a portion of the waveguide core layer.

18 Claims, 4 Drawing Sheets

| ELECTRODE 18 |
| --- |
| CLADDING LAYER 12 |
| ACTIVE WAVEGUIDE REGION 16 |
| CLADDING LAYER 14 |

| ELECTRODE 17 | |
| --- | --- |
| CLADDING LAYER 15 | p-InGaP |
| ACTIVE LAYER 13 | GaAs/InGaAs |
| PASSIVE WAVEGUIDE LAYER 11 | GaAs |
| CLADDING LAYER 10 | n-AlGaAs |

SEMICONDUCTOR AMPLIFIER OR LASER HAVING INTEGRATED LENS

TECHNICAL FIELD

This invention relates generally to semiconductor amplifiers, and more particularly to semiconductor amplifiers having an integrated lens for providing lateral waveguiding control.

BACKGROUND OF THE INVENTION

Optical systems and circuits require a variety of devices incorporating optical structures. For example, optical amplifiers may be used in long-haul optical fiber communication systems. Alternatively, optical amplifiers may serve as a pumping source for fiber amplifiers. For these applications optical amplifiers that provide high output power are particularly attractive. High power is achieved by increasing the total electrical power applied to the amplifier, which requires that the amplifier have a large lateral dimension.

A number of optical amplifiers are known which have an increased lateral dimension. Such amplifiers include broad-area structures, tapered passive waveguides for adiabatic beam expansion (see, for example, Koren et al., "High-power laser amplifier photonic integrated circuit for 1.48 micron wavelength operation," *Appl. Phys. Lett.*, vol. 59, pp. 2351–2353, 1991) and tapered active region devices (see, for example, Yazaki et al., *IEEE Photon Tech. Lett.*, 3, 1060, 1991; and Walpole et al., "High-power strained-layer InGaAs/AlGaAs tapered traveling wave amplifier," *Appl. Phys. Lett.*, vol. 61, pp. 740–742, 1992). For example, Koren et al. discloses a 1.48 micron integrated laser/amplifier device having a continuous-wave (CW) output power of up to 0.37 W. By providing a tapered amplifier without lateral guiding and widths up to 250 microns CW output powers of 1–2 W have been achieved. Additionally, a short-wavelength tapered amplifier operating at 0.98 microns has been shown to provide 3.1 W of CW output power (see J.N. Walpole et al., "High Power tapered semiconductor amplifiers and lasers at 980 nm," in *Proc. Conf. IEEE/LEOS* Annu. Meeting, Boston, Mass., paper PD2, Nov. 1992.).

Tapered optical amplifiers provide a number of advantages over other types of optical amplifiers. For example, such amplifiers provide high saturation power, suppression of backward-amplified spontaneous emission, and reduced sensitivity to facet reflection. However, there are also a number of drawbacks associated with tapered amplifiers and large laterally dimensioned semiconductor amplifiers generally. These difficulties arise from the lack of lateral waveguiding control and include such problems as the inability to efficiently couple the amplifier output, which is distributed over a relatively large area, into a single-mode fiber.

Accordingly, it is desirable to provide a semiconductor amplifier having a large lateral dimension for supplying high output power in which the lateral waveguiding of the optical power can be controlled.

SUMMARY OF THE INVENTION

In accordance with this invention a semiconductor amplifier has been developed which is capable of providing lateral waveguiding control. In one embodiment of the invention an optical device is provided which includes a semiconductor optical amplifier and a lens for receiving optical energy from the optical amplifier. The lens and the optical amplifier are monolithically integrated on a common substrate. The optical amplifier may be of the type having a tapered active region. Rather than an optical amplifier, a semiconductor laser may be integrated with the lens.

The lens may be formed by changing the refractive index of the waveguide core which is formed in the semiconductor material. This refractive index change may be produced by changing the thickness of a portion of the waveguide core layer. In one embodiment of the invention, the lens is formed at the boundary between the amplifying section and the passive section of the optical device. In this case the change in core thickness should be provided at this boundary.

BRIEF DESCRIPTION OF THE DRAWINGS

FIGS. 1(*a*) and 1(*b*) show cross-sectional views of known semiconductor optical amplifier structures.

DETAILED DESCRIPTION

Figures 1A, 1B, 2:
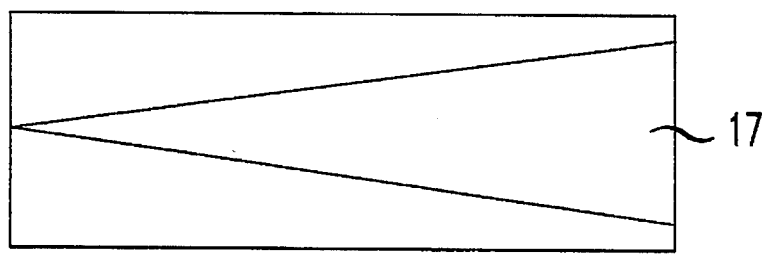
FIG. 2 shows a plan view of a known tapered optical amplifier.

A semiconductor amplifier typically comprises a semiconductor heterostructure, which is formed from more than one semiconductor material such as gallium arsenide (GaAs) and aluminum gallium arsenide (AlGaAs). Semiconductor amplifiers are made from a combination of semiconductor materials which have different bandgap energies to achieve electrical carrier confinement as well as different optical indices of refraction to achieve optical confinement.

Many types of semiconductor optical amplifiers are known for providing high-power, continuous-wave operation. One such type that will be described below employs a laterally tapered gain region. While the present invention will be described in terms of a tapered optical amplifier, one of ordinary skill in the art will recognize that the invention is not limited to tapered amplifiers and may be employed with any type of semiconductor optical amplifier.

In general, the semiconductor amplifier may be composed of any direct-band gap semiconductor ternary or quaternary alloy system whose various alloys can be selected to have lattice constants close to that of the substrate crystal, which may be, for example, GaAs or InP. Material systems for fabricating the semiconductor amplifier of the invention include, for example, GaAsP/InP, GaAs/AlGaAs, GaAs/AlAs, InGaAs/InAlAs, InGaAs/InGaAlAs, and GaAsSb/GaAlAsSb. Moreover, mismatching is also contemplated wherein strained layers are grown over the substrate material. Finally, extension of the device structures is also contemplated to include semiconductor compounds in Group II–VI.

One example of a heterostructure tapered amplifier having an active waveguide region is composed of three layers of semiconductor material, as shown in FIG. 1(*a*). A p-type material 12 having a relatively high bandgap and an n-type material 14 also having a relatively high bandgap form the cladding layers of the device. The cladding layers 12 and 14 may be composed of AlGaAs, for example. The active waveguide layer 16, which defines the waveguide core, is sandwiched between the cladding layers 12 and 14 and is formed from a relatively low bandgap material such as GaAs or a more complex multiple layer sequence. An electrode 18 such as AuZn/Au is deposited over the cladding layer 12. A contact layer composed of p$^+$-type GaAs, for example, may be interposed between the electrode 18 and the cladding layer 12 to enhance electrical conductivity.

An example of a heterostructure tapered amplifier having a passive waveguide layer is composed of four semiconductor layers and is shown in FIG. 1(b). The cladding layers 15 and 10 are composed of relatively high bandgap materials such as n-type AlGaAs and p-type InGaP, for example. Sandwiched between the cladding layers 10 and 15 are a passive waveguide layer 11 and an active layer 13 adjacent thereto. The passive waveguide layer 11 and the active layer 13 together define the waveguide core of the device. The passive waveguide layer 11 is formed from an undoped material such as GaAs, which has a bandgap energy higher than the bandgap of the active layer 13 but lower than the bandgap of the cladding layers 10 and 15. The active layer 13 is formed from a material which may have a composite multilayer configuration such as a GaAs/InGaAs multiple quantum well structure, for example. As with the active waveguide device seen in FIG. 1(a), an electrode 17 is deposited on the cladding layer 15 and a contact layer may be interposed therebetween.

The semiconductor amplifiers shown in FIGS. 1(a) and 1(b) may be provided with a tapered gain region in which the width of the active region is increased exponentially or linearly along the direction of light propagation to reduce the power density in the cross section of the device. The taper provides a narrow input width so that the available power from an external oscillator (e.g., a laser) can be efficiently coupled into the amplifier. As a result of the increasing width of the taper only a modest input power is required to achieve a large input power density, thus maintaining an efficient level of gain saturation over nearly all of the amplifier length. The tapered gain region may be formed by depositing a layer of SiO$_2$ prior to deposition of the electrode. A portion of the oxide layer defining a taper is then removed, as indicated in the plan view shown in FIG. 2. After this portion of the oxide is removed the electrode is deposited so that electrical contact is formed only between the tapered portion of the surface and the remainder of the device.

Rather than defining the taper with a patterned dielectric layer, the tapered shape also may be achieved by masking the structure and depositing the active layer material on the unmasked portion which is tapered in shape. The remainder of the structure in the plane of the active layer then may be formed from a semiconductor material having a high electrical resistance. In this case the layer above this high resistance material, which would otherwise form part of the cladding layer, is also composed of a high resistance semiconductor material.

Figure 3:
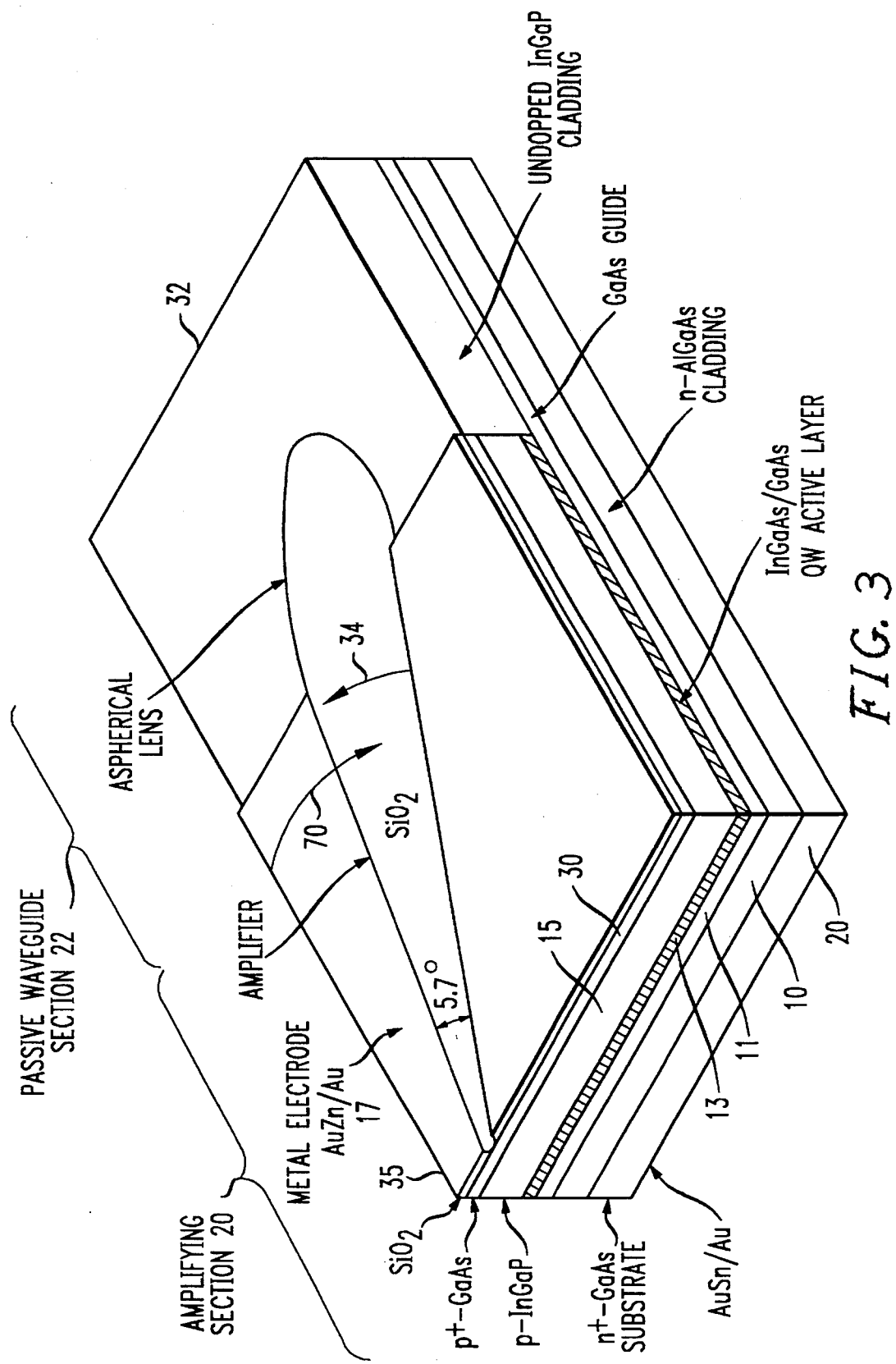
FIG. 3 shows a perspective view of one embodiment of an optical amplifier integrated with a lens in accordance with this invention.

FIG. 3 shows a semiconductor amplifier for operation at a wavelength of 0.98 microns. The amplifier has a structure similar to that shown in FIG. 1(b) and further has a monolithically integrated waveguide lens in accordance with this invention. The amplifier is composed of an amplifying section 20 and a passive waveguiding section 22 which are integrated on the substrate 26. Those layers shown in FIG. 3 which correspond to layers shown in FIG. 1(b) are provided with like reference numerals. The passive waveguiding section 22 is similar in structure to the amplifying section 20 except that the active layer 13 is absent and the cladding layer 15 is grown separately from the cladding layer in the amplifying section 20. The passive waveguiding section 22 may also comprise a multilayer waveguide structure which is grown separately from the amplifying section 20 but on the same substrate. In this case, assuming the amplifier structure shown in FIG. 1(a) is used, the core of the passive waveguiding section 22 is connected to the active waveguide layer 16 by butt-joining. The cladding layers in the passive section 22 may be either doped or undoped. Undoped cladding layers can reduce the waveguide propagation loss in the passive regions. In the embodiment of the invention shown in FIG. 3, the lens 28 is formed in the amplifying section 20 at the boundary between the amplifying section 22 and the passive waveguiding section 22.

As disclosed in Verdiell et al., Appl. Phys. Lett 62 (8), 1993, which is hereby incorporated by reference, a lens may be formed in a planar waveguide by changing the thickness of the waveguide layer to produce a change in the effective index of refraction. In the embodiment of the invention shown in FIG. 3, the refractive index difference for the lens is produced by the difference in the core thickness between the amplifying section 20 and the passive waveguiding section 22 of the device. This change in thickness results from the absence of the active layer 13 in the passive waveguiding section 22 so that the core is composed only of the passive waveguide layer 11. For the particular material system shown in FIG. 3, the calculated refractive index step Δn/n from the amplifying section 20 to the passive waveguiding section 22 is 2.3%. The shape of the lens may be designed by the conventional ray tracing method or by the beam propagation calculation. The results of these methods have been shown to be in good agreement with fabricated structures.

In an alternative embodiment of the invention, the lens may be placed within either the amplifying section 20 or the passive waveguiding section 22 rather than at the boundary therebetween. In these embodiments the change in refractive index may be accomplished by varying the thickness of the active layer and/or the passive waveguide layer at the location defining the lens.

The optical amplifier shown in FIG. 3 may be fabricated by a variety of processes including a two-step MOVPE process or multiple step LPE, MBE or CBE processes, for example. In one embodiment of the invention, the structure is composed of a 0.8 micron thick n-type Al$_{0.5}$GaAs bottom cladding layer 10 deposited on an n$^+$-GaAs substrate 26. A 0.2 micron undoped GaAs layer forms the passive waveguide layer 11. A thin InGaP stop etch layer is deposited on the passive waveguide layer 11. The active layer 13 is composed of a 500 angstrom GaAs bottom barrier layer, three 40 angstrom compressively strained In$_{0.3}$Ga$_{0.7}$As quantum wells with 80 angstrom GaAs barriers and a 700 angstrom GaAs top barrier layer. A 1 micron p$^+$-type InGaP layer forms the top cladding layer 15, over which is deposited a p-type GaAs contact layer 30. The cladding layer 15 and the active layer 13 are etched away from a section of the structure to define the passive waveguiding section 22. While the passive waveguiding section 22 is being formed, the lens is defined by wet chemical etching and is configured to have a shape determined by one of the methods mentioned above. Subsequent to the formation of the lens, a 1.2 micron thick undoped InGaP layer is deposited in a second MOVPE step to form the cladding layer 15 in the passive waveguiding section 22. This undoped InGaP layer is etched away from the amplifying section 20.

In the embodiment of the invention shown in FIG. 3, the taper angle 34 is approximately 5.7 degrees. In contrast to known tapered optical amplifiers, the optical axis of the taper is tilted by approximately 7 degrees to suppress facet reflections. This eliminates the need for etched grooves at the input facet 36 of the device such as employed in the tapered amplifier disclosed in the Appl. Phys. Rev. Lett. reference to Walpole et al. cited above. The output facet 32 may be provided with an antireflection coating to further suppress reflections and increase the output light power. If the coating is not employed, the amplifier shown in FIG. 3 reaches self-oscillation at an injection current of approximately 1 A. When the coating is employed oscillations are completely eliminated.

The lens may have any shape necessary to produce any degree of lateral waveguiding that is desired. For example, the lens 28 in FIG. 3 is configured aspherically so that its focal point is located in the passive waveguiding section 22 near the output facet 32. One advantage of such a lens configuration is that the device experiences a high optical density only in the vicinity of the focal point and hence high optical densities are avoided in the amplifying section 20 where they could adversely effect the functionality of the device due to facet damage. Thus, the optical amplifier of the invention has an enhanced resistance to catastrophic optical damage, which is known to occur in certain tapered optical amplifiers.

In another embodiment of the invention, the lens is shaped to form a collimating lens. This configuration may be advantageously employed, for example, when the output of the device is to be coupled to a free space region.

Figure 4:
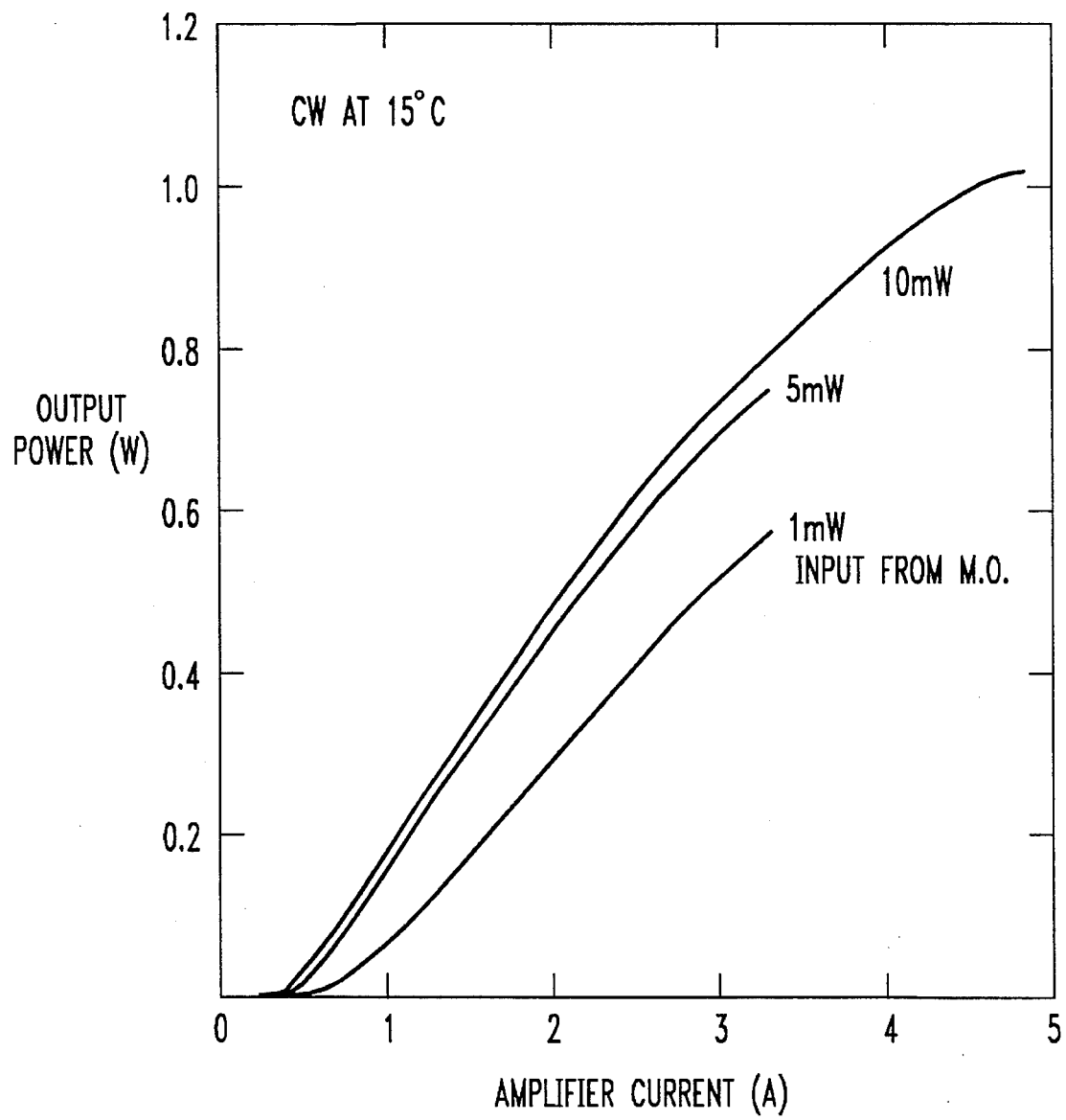
FIG. 4 shows a graph of the output power for the device shown in FIG. 3 as a function of amplifier current for various optical input energies.
Figure 5:
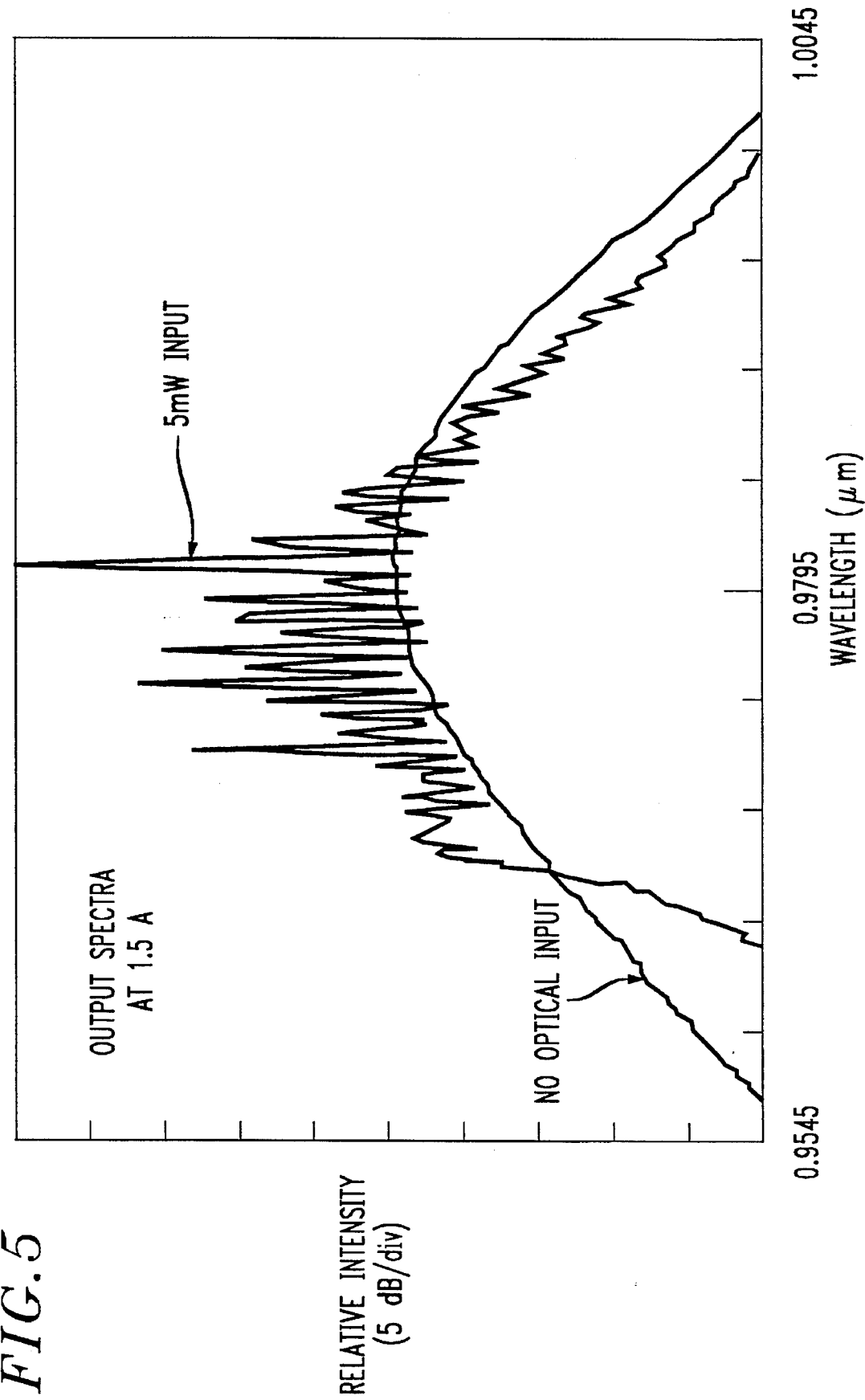
FIG. 5 shows the master-oscillator power amplifier output for a current of 1.5 A.

FIG. 4 shows a graph of the output power from the optical amplifier shown in FIG. 3 as a function of amplifier current for optical inputs from a master oscillator of 1 mW, 5 mW, and 10 mW. The light input to the amplifier was produced by a master oscillator laser located external to the amplifier. However, the invention also contemplates an arrangement wherein the master oscillator laser is monolithically integrated with the amplifier. The data shown in FIG. 4 was obtained while the amplifier was mounted on a copper heat sink maintained at a temperature of 15° C. The input power to the amplifier was estimated from the photocurrent of the amplifier when the amplifier was unbiased. As seen in FIG. 4, with an input power of 10 mW, the output power reached 1 W at an applied current of approximately 4.5 A. The output gain saturates as the input is increased to 10 mW, indicating that the optical amplifier can be designed to operate with a master oscillator power of less than 10 mW while still achieving a high output power by increasing the length of the amplifier. FIG. 5 shows the master-oscillator power amplifier output spectrum at 1.5 A current. The output is composed essentially of the amplified input from the 0.98 micron master oscillator laser, which is in contrast to the spontaneous emission from the amplifier when there is no optical input.

The invention has been described in terms of an optical amplifier monolithically integrated with a lens. However, the invention also contemplates the integration of a lens with a broad area semiconductor laser instead of an amplifier. The structure of such a laser is substantially identical to the amplifier described above. For example, the device shown in FIG. 3 was operated above the lasing threshold at an applied current of 1 A. However, the structure shown in FIG. 3 may be modified as needed to form an optimal laser configuration. For example, it may be advantageous to reduce the tilt angle of the tapered region to 0° so that the propagation of the optical energy is normal to the facets 26 and 32 defining the laser cavity. Moreover, the reflectivity of facet 32 may be increased over that employed for an amplifier configuration.

We claim:

1. An optical device comprising:

a semiconductor optical amplifier; and a lens for receiving optical energy from the optical amplifier, said lens and said optical amplifier being monolithically integrated on a common substrate, said lens having a focal point located within said common substrate.

2. The device of claim 1 wherein said lens comprises a portion of a waveguiding core layer of semiconductor material having a thickness of predetermined variation.

3. The device of claim 2 wherein said portion of the waveguiding core layer has a predetermined shape defining the shape of the lens.

4. The device of claim 1 wherein said focal point is located within said device near a facet of said common substrate.

5. The device of claim 1 wherein said optical amplifier includes a waveguide core having an active layer for supplying gain and an outer layer of electrically conductive material having a tapered shape that increases in width along a propagation axis of the optical amplifier, the portion of said active layer located beneath said outer conductive layer comprising a gain region of said conductive layer, said lens being located at a point along the propagation axis to receive optical energy from said waveguide core.

6. The device of claim 5 wherein said taper terminates in the direction of the propagation axis at a boundary between an amplifying section and a passive waveguiding section, said lens being located along said boundary.

7. The device of claim 5 wherein said waveguide core of said optical amplifier further comprises a passive waveguide layer in contact with said active layer.

8. The device of claim 6 wherein said taper forms an acute angle with a lateral surface oriented perpendicular to an input facet.

9. The device of claim 8 wherein said acute angle is approximately equal to 7°.

10. The device of claim 7 wherein said waveguide core is formed from a InGaAs/GaAs multiple quantum well structure.

11. A monolithic semiconductor structure comprising:

a substrate defining an amplifying section and a passive waveguiding section;

a bottom cladding layer, a core layer and a top cladding layer all formed from semiconductor materials and disposed on said amplifying section and said passive waveguiding section of the substrate, the portion of the core layer in the amplifying section including a semiconductor material for supplying gain to an optical signal and the portion of the core layer in the passive waveguiding section forming a passive waveguide layer that does not supply gain; and a lens having a prescribed shape and integrated on said substrate at a location such that optical energy propagating in the core layer passes through said lens, said lens having a focal point located within said structure.

12. The structure of claim 11 wherein said lens is disposed at a boundary between said amplifying section and said passive waveguiding section, said lens formed by producing a refractive step index resulting from a difference in thickness between the core layer in the amplifying section and the core layer in the passive waveguiding section.

13. The structure of claim 11 wherein said lens has a focal point located within the passive waveguiding section near a facet of said substrate.

14. An optical device comprising:

a semiconductor laser; and a lens for receiving optical energy from the laser, said lens and said laser being monolithically integrated on a common substrate, said lens having a focal point located within said device.

15. The device of claim 14 wherein said lens is formed by a predetermined change in thickness of a portion of a waveguiding core layer of semiconductor material.

16. The device of claim 14 wherein said lens has a focal point located within said device near a facet of said common substrate.

17. The device of claim 14 wherein said semiconductor laser includes a waveguide core having an active layer for supplying gain and an outer layer of electrically conductive material having a tapered shape that increases in width along a propagation axis of the laser, the portion of said active layer located beneath said outer conductive layer comprising a gain region of said conductive layer, said lens being located at a point along the propagation axis to receive optical energy from said waveguide core.

18. The device of claim 17 wherein said taper terminates in the direction of the propagation axis at a boundary between a active section and a passive waveguiding section, said lens being located along said boundary.

* * * * *